(12) United States Patent
Ball

(10) Patent No.: US 6,732,902 B2
(45) Date of Patent: May 11, 2004

(54) LEAD PENETRATING CLAMPING SYSTEM

(75) Inventor: Michael B. Ball, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/213,019

(22) Filed: Aug. 5, 2002

(65) Prior Publication Data

US 2002/0185520 A1 Dec. 12, 2002

Related U.S. Application Data

(63) Continuation of application No. 09/876,806, filed on Jun. 7, 2001, now Pat. No. 6,494,357, which is a continuation of application No. 09/419,851, filed on Oct. 19, 1999, now Pat. No. 6,305,593, which is a division of application No. 08/909,230, filed on Aug. 11, 1997, now Pat. No. 6,047,877, which is a continuation of application No. 08/631,143, filed on Jun. 17, 1996, now Pat. No. 5,673,845.

(51) Int. Cl.⁷ .......................... B23K 37/04; B23K 31/02
(52) U.S. Cl. ..................... 228/4.5; 228/44.7; 228/180.5
(58) Field of Search ................. 228/4.5, 44.7, 228/180.5, 212, 213, 1.1, 110.1; 269/54.4, 54.5, 90.3, 54.1, 141, 151, 164; 219/161, 56.21, 56.22; 156/73.1, 73.2, 580.1, 580.2

(56) References Cited

U.S. PATENT DOCUMENTS

| | | |
|---|---|---|
| 3,650,454 A | 3/1972 | Coucoulas |
| 3,670,394 A | 6/1972 | Daniels et al. |
| 3,685,137 A | 8/1972 | Gardiner |
| 3,984,166 A | 10/1976 | Hutchison |
| 3,995,845 A | 12/1976 | Scheffer |
| 4,103,718 A | 8/1978 | Steigerwald |
| 4,361,261 A | 11/1982 | Elles et al. |
| 4,434,347 A | 2/1984 | Kurtz et al. |
| 4,467,138 A | 8/1984 | Brorein |
| 4,527,730 A | 7/1985 | Shirai et al. |
| 4,600,138 A | 7/1986 | Hill |
| 4,653,681 A | 3/1987 | Dreibelbis et al. |
| 4,765,531 A | 8/1988 | Ricketson et al. |
| 4,821,945 A | 4/1989 | Chase et al. |
| 5,035,034 A | 7/1991 | Cotney |
| 5,109,269 A | 4/1992 | Holzman |
| 5,210,936 A | 5/1993 | Simmons et al. |
| 5,283,946 A | 2/1994 | Simmons et al. |
| 5,307,978 A | 5/1994 | Ricketson et al. |
| 5,322,207 A | 6/1994 | Fogal et al. |
| 5,425,491 A | 6/1995 | Tanaka et al. |
| 5,465,899 A | 11/1995 | Quick et al. |
| 5,647,528 A | 7/1997 | Ball et al. |
| 5,673,845 A | 10/1997 | Ball |
| 5,890,644 A | 4/1999 | Ball |
| 5,954,842 A | 9/1999 | Fogal et al. |
| 6,047,877 A | 4/2000 | Ball |
| 6,206,274 B1 | 3/2001 | Ball |
| 6,305,593 B1 | 10/2001 | Ball |
| 6,419,145 B2 | 7/2002 | Ball |
| 6,494,357 B2 * | 12/2002 | Ball |
| 2001/0013531 A1 | 8/2001 | Ball |
| 2001/0027988 A1 * | 10/2001 | Ball |
| 2001/0027989 A1 | 10/2001 | Ball |
| 2002/0185520 A1 * | 12/2002 | Ball |

* cited by examiner

Primary Examiner—Kiley Stoner
(74) Attorney, Agent, or Firm—TraskBritt

(57) ABSTRACT

An apparatus and method of forming improved wire bonds between the contact pads on semiconductor devices and individual lead frame fingers of a lead frame. The apparatus and method include the use of a penetrating individual independent lead finger clamp during the wire bonding process to provide increased stability of the individual lead finger for improved bonding by the clamp penetrating a portion of the lead finger being bonded. If desired, the apparatus and method also provide for the use of either a penetrating or nonpenetrating fixed clamp for the lead fingers during the wire bonding process in addition to the penetrating individual independent lead finger clamp during the wire bonding process to provide increased stability of the individual lead finger for improved bonding.

22 Claims, 11 Drawing Sheets

LEAD PENETRATING CLAMPING SYSTEM

CROSS-REFERENCE TO RELATED APPLICATIONS

This application is a continuation of application Ser. No. 09/876,806, filed Jun. 7, 2001, now U.S. Pat. No. 6,494,357, issued Dec. 17, 2002, which is a continuation of application Ser. No. 09/419,851, filed Oct. 19, 1999, now U.S. Pat. No. 6,305,593, issued Oct. 23, 2001, which is a divisional of application Ser. No. 08/909,230, filed Aug. 11, 1997, now U.S. Pat. No. 6,047,877, issued Apr. 11, 2000, which is a continuation of application Ser. No. 08/631,143, filed Jun. 17, 1996, now U.S. Pat. No. 5,673,845, issued Oct. 7, 1997.

BACKGROUND OF THE INVENTION

This application is related to Ser. No. 08/597,616, filed Feb. 6, 1996, now U.S. Pat. No. 5,647,528, issued Jul. 15, 1997, and is also related to Ser. No. 08/592,058, filed Jan. 26, 1996, now U.S. Pat. No. 5,954,842, issued Sep. 21, 1999.

1. Field of the Invention

The present invention is related to forming wire bonds between the contact pads on semiconductor devices and individual lead frame fingers of a lead frame.

More specifically, the present invention is related to the apparatus and method of forming improved wire bonds between the contact pads on semiconductor devices and individual lead fingers of a lead frame using one or more independently actuated lead penetrating bond head lead clamps or a fixed bond head clamp which may be either penetrating or not during the wire bonding process.

2. State of the Art

Well known types of semiconductor chip devices are connected to a component known as lead frames and subsequently encapsulated in plastic for use in a wide variety of applications. The lead frame is typically formed from a single continuous sheet of metal, typically by metal stamping operations. The lead frame includes an outer supporting frame, and may include a central semiconductor chip supporting pad and a plurality of lead fingers, each lead finger having, in turn, a terminal bonding portion near the central chip supporting pad. Ultimately, the outer supporting frame of the lead frame is removed after the wire bonds between the contact pads of the semiconductor chip device and the lead fingers have been made and after the encapsulation of the semiconductor chip and portion of the lead fingers.

Since the lead frames are formed continuously using stamping operations, they are typically continuously rolled on a suitable reel and provided for use. Such reeling operations of the lead frames cause the lead frames to have induced stresses and deformations therein leading to lead frames exhibiting longitudinal curvature and transverse curvature, as well as deformation of the individual leads of the lead frame. Such lead frame curvature and any attendant deformation of the leads and lead frame cause problems in the formation of reliable wire bonds with the contact pads of semiconductor devices and the individual lead fingers of the lead frame. Particularly, problems arise when the size of the semiconductor is decreased, the number of contact pads on the semiconductor device is increased, and the number of lead fingers on the lead frame is increased. In order to form the desired connections between the bond pads of a semiconductor device and a lead frame during the wire bonding process, the lead fingers of the lead frame must be immobilized in a known, predetermined location with respect to the semiconductor device.

Typical apparatus and methods for forming the wire bonds between the contact pads on semiconductor devices and the lead fingers, of lead frames are illustrated in U.S. Pat. Nos. 4,361,261, 4,527,730, 4,600,138, 4,653,681, 4,765,531, and 5,465,899. However, such apparatus and methods do not address the problem of deformed lead frames and their effect on the wire bonds.

Typically, the deformation of the lead frames and its effect on the quality of wire bonds have been dealt with through the use of clamps on portions of the lead frames during the wire bonding operation. In U.S. Pat. No. 4,434,347 a circular fixed clamp is used to retain the lead fingers of the lead frame during the wire bonding operation. A spring loaded electrode is used to heat the end of the lead finger to help improve bonding of the wire.

In U.S. Pat No. 5,322,207 a fixed clamp is used to retain the lead frame during the automated wire bonding process for connecting the bond pads of a semiconductor device to lead fingers of a lead frame.

In U.S. Pat No. 5,307,978 a fixed clamp is illustrated for use in an apparatus and method for orienting bonding sites of a lead frame at a bonding station of an automatic wire bonder.

In U.S. Pat No. 5,035,034 a hold-down clamp having a multi-fingered interchangeable insert for wire bonding semiconductor lead frames is illustrated. The circular clamp insert includes a plurality of individual fingers used to bias a lead finger of a lead frame in the wire bonding process to provide a better wire bond by attempting to immobilize the lead frame during bonding operations.

In U.S. Pat No. 3,685,137 the jaws of a lead frame clamp are used to force the lead fingers of a lead frame into a fixed position during the wire bonding process.

In U.S. Pat No. 4,821,945 a method and apparatus for the single lead automated clamping and bonding of lead fingers of lead frames are illustrated. However, such apparatus and method are used to replace the fixed clamp during such wire bonding. Additionally, the individual clamp is concentrically located with respect to the wire bonding apparatus and must rotate therearound during wire bonding operations.

While such prior art apparatus and methods have been directed in attempting to solve the problems of forming reliable wire bonds between the contact pads of semiconductor devices and lead fingers of lead frames, they have not been as successful because none of the prior art clamps effectively immobilizes a lead finger during wire bonding operations as the clamps merely engage the surface of a lead finger, if properly positioned thereon.

The present invention is directed to an improved wire bonding apparatus and method for forming wire bonds between semiconductor devices and lead frames by immobilizing the lead finger during the wire bonding process.

SUMMARY OF THE INVENTION

The present invention is related to the apparatus and method of forming improved wire bonds between the contact pads on semiconductor devices and individual lead frame fingers of a lead frame. In one instance, the present invention includes the use of a penetrating individual independent lead finger clamp during the wire bonding process to provide increased stability of the individual lead finger for improved bonding by the clamp penetrating a portion of the lead finger being bonded. In another instance, the present invention also provides for the use of either a penetrating or non-penetrating fixed clamp for the lead fingers during the wire bonding process in addition to the penetrating individual independent lead finger clamp during the wire bonding process to provide increased stability of the individual lead finger for improved bonding. The present invention also contemplates the replacement of the penetrating fixed clamp with another, or second, penetrating independent clamp in addition to the first individual independent lead finger clamp during the wire bonding process. With the improved clamping of the lead finger by the clamp penetrating a portion of the lead finger the present invention allows improved wire bond impressions and improved bond strength.

BRIEF DESCRIPTION OF THE SEVERAL VIEWS OF THE DRAWINGS

The present invention will be better understood when the description of the invention is taken in conjunction with the drawings wherein.

DETAILED DESCRIPTION OF THE INVENTION

Figure 1:
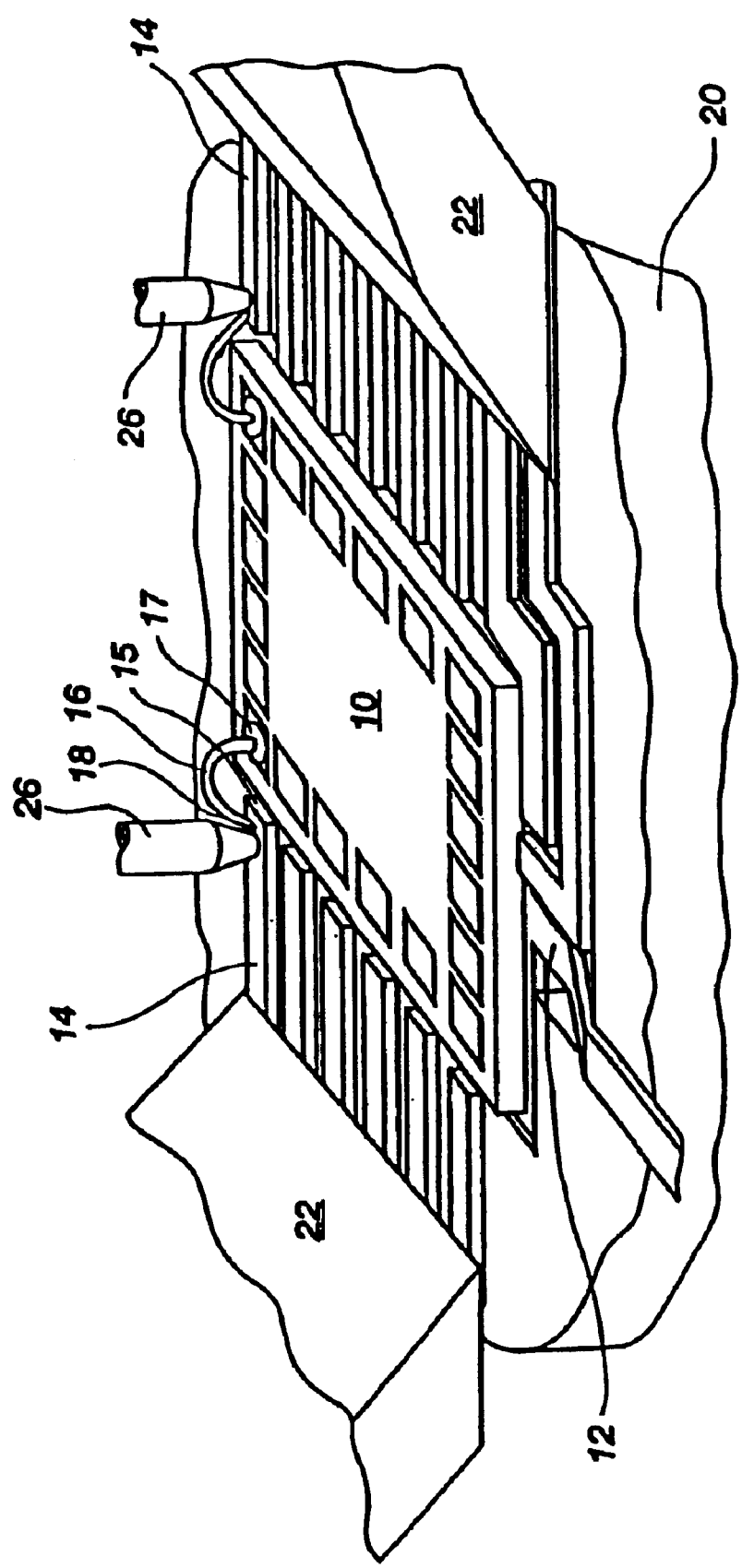
FIG. 1 is a perspective view of an independent individual clamp and a fixed clamp used in a wire bonding process.

Referring to drawing FIG. 1, a semiconductor device (chip or die;) 10 is shown being supported by the paddle 12 of a lead frame. A heat block 20 is used to heat the paddle 12, die 10, and lead fingers 14 during the wire bonding process. As shown, a suitable wire 16 has one end thereof 17 bonded to a bond pad of the die 10. The wire 16 may be of any suitable type for connection and bonding purposes, such as gold, gold alloy, aluminum, aluminum alloy, etc. The other end 18 of the wire 16 is shown being bonded to the end 15 of a lead finger 14 of the lead frame by a suitable bonding apparatus 26. The bonding apparatus 26 may be of any suitable type well known in the bonding area, such as a tailless thermosonic or ultrasonic capillary type bonding apparatus which dispenses wire during the bonding process. As previously stated, the lead finger 14 is in contact with the heat block 20 to heat the lead finger 14 to a suitable temperature for the bonding operation to help ensure a satisfactory wire bond. If desired, in the wire bonding operation, further shown in contact with lead finger 14 is a portion of a conventional clamp 22 used to clamp portions of the lead frame during such bonding operations. The clamp 22 may be of any well known suitable type, such as those described hereinbefore, and is generic in shape. During the wire bonding process it is desirable for the heat block to be heated to substantially 230 degrees Centigrade. Although the heat block may be any suitable temperature during the bonding operation, the heat block 20 temperature should not exceed 300 degrees Centigrade to prevent thermal damage to the die 10. It is further preferred that the bond of the other end 18 of the wire 16 made to the end 15 of the lead finger 14 be made at a temperature of substantially 190 degrees Centigrade for bonding effectiveness. It is also preferred that the bonding apparatus typically exert a bonding force of substantially 50 to 100 grams when bonding the other end 18 of the wire 16 to the end 15 of lead finger 14 for effective bond formation of the wire 16 to lead finger 14.

The independent clamp 24 (FIG. 1A) may be of any suitable shape for use in independently clamping the lead finger 14, in place of the use of conventional fixed clamp 22, such as square, semicircular, rectangular, arcuate, etc. Also, as shown, the independent clamp 24 may be resiliently mounted through the use of a shoulder 49 thereon abutting a spring 52 to control the amount of the force exerted on any lead finger 14 during the wire bonding operation. If desired, the independent clamp 24 may include insulation or cushioning on the end thereof. The independent clamp 24 is actuated independently of bonding apparatus 26 and has the capability of independent movement along the x-axis, y-axis and z-axis with respect to the bonding apparatus 26. The independent clamp 24 is also free to move about the bonding apparatus 26 and the central axis of the die 10 so that any lead finger 14 that is to be connected to a bond pad on the die 10, regardless of location, may be accommodated. The independent clamp 24 does not need to be, and preferably is not, concentrically centered about the bonding apparatus 26 so that it will not interfere with the operation thereof. Any desired number of independent clamps 24 may be used about the bonding apparatus to minimize the amount of movement of the lead finger 14 between wire bonding operations. The independent clamps 24 may be located in quadrants about the die 10, or in any manner as desired.

Figure 1A:
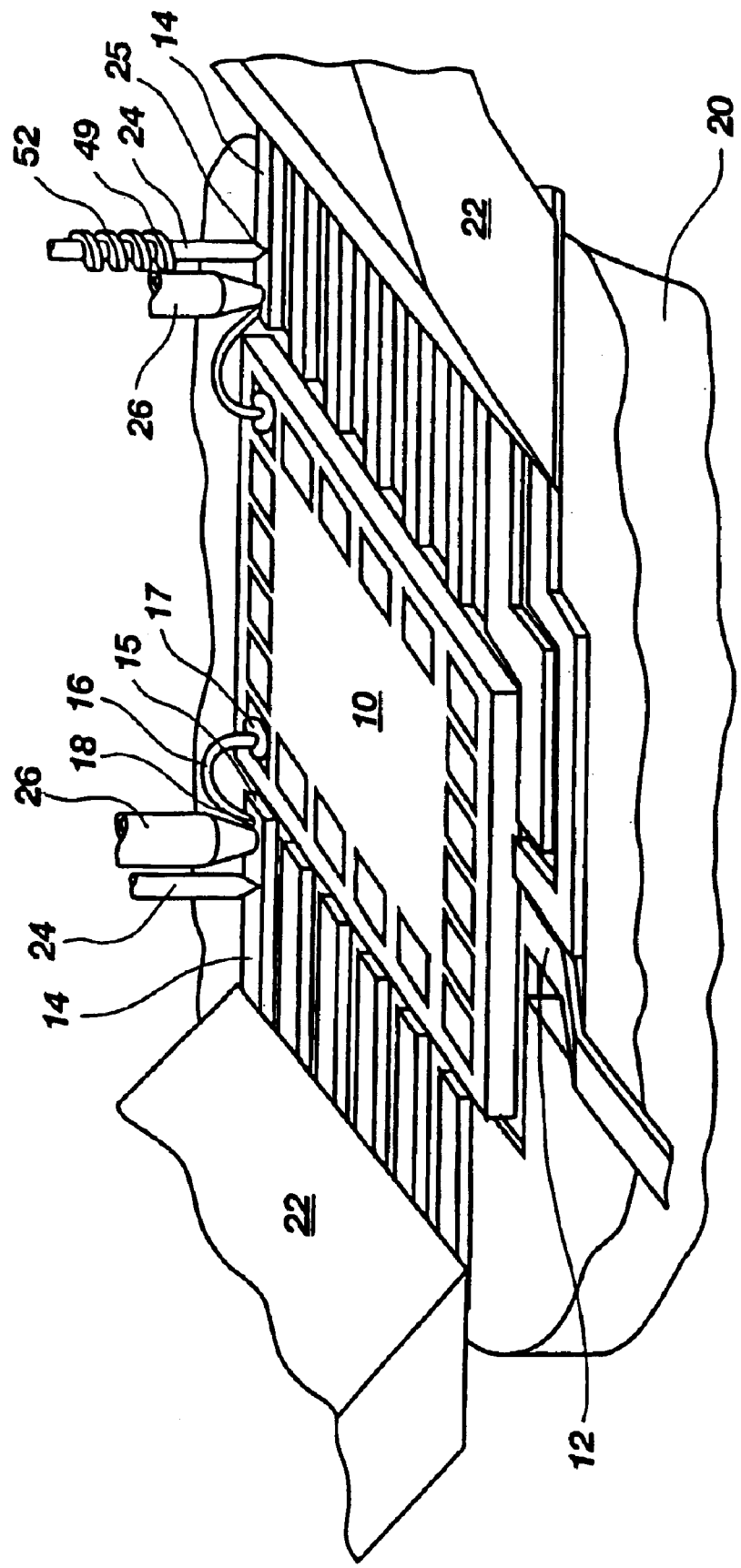
FIG. 1A is a perspective view of a penetrating independent individual clamp and a fixed clamp of the present invention.

Referring to drawing FIG. 1A, a semiconductor device (chip or die) 10 is shown being supported by the paddle 12 of a lead frame in the manner as described in drawing FIG. 1 hereinbefore. Further shown in drawing FIG. 1A is an independently actuated lead clamp of the present invention having a lead finger penetrating portion 25 on the bottom thereof used in place of or in addition to the conventional (fixed) clamp 22 to maintain the lead finger 14 in position during the bonding process. The independent clamp 24 helps ensure that the lead finger 14 is in contact with the heat block 20 during the bonding process, immobilizes the lead finger 14 during the wire bonding process, and helps minimize any deflection of the end 15 of the lead finger 14 so that the bonding apparatus 26 accurately, precisely contacts the end 15 to provide the desired wire bond. The action of independent clamp 24, and, if desired the additional use of fixed clamp 22, provides improved clamping and immobilization of a lead finger 14 during the wire bonding process as well as ensures that the lead finger 14 is in intimate contact with the heat block 20 for effectiveness.

During the wire bonding process it is desirable for the heat block to be heated as described hereinbefore. Similarly, the bonding apparatus should exert substantially the same amount of force as described hereinbefore.

The independent clamp 24 (FIG. 1A) may be of any suitable overall exterior shape for use in independently clamping the lead finger 14, in place of the use of conventional fixed clamp 22, such as square, semicircular, rectangular, arcuate, etc. Also, as shown, the independent clamp 24 may be resiliently mounted through the use of a shoulder 49 thereon abutting a spring 52 to control the amount of the force exerted on any lead finger 14 during the wire bonding operation. The independent clamp 24 is actuated independently of bonding apparatus 26 and has the capability of independent movement along the x-axis, y-axis and z-axis with respect to the bonding apparatus 26. The independent clamp 24 is also free to move about the bonding apparatus 26 and the central axis of the die 10 so that any lead finger 14 that is to be connected to a bond pad on the die 10, regardless of location, may be accommodated. The independent clamp 24 does not need to be, and preferably is not, concentrically centered about the bonding apparatus 26 so that it will not interfere with the operation thereof. Any desired number of independent clamps 24 may be used about the bonding apparatus to minimize the amount of movement of the lead finger 14 between wire bonding operations. The independent clamps 24 may be located in quadrants about the die 10, or in any manner as desired.

Figure 2:
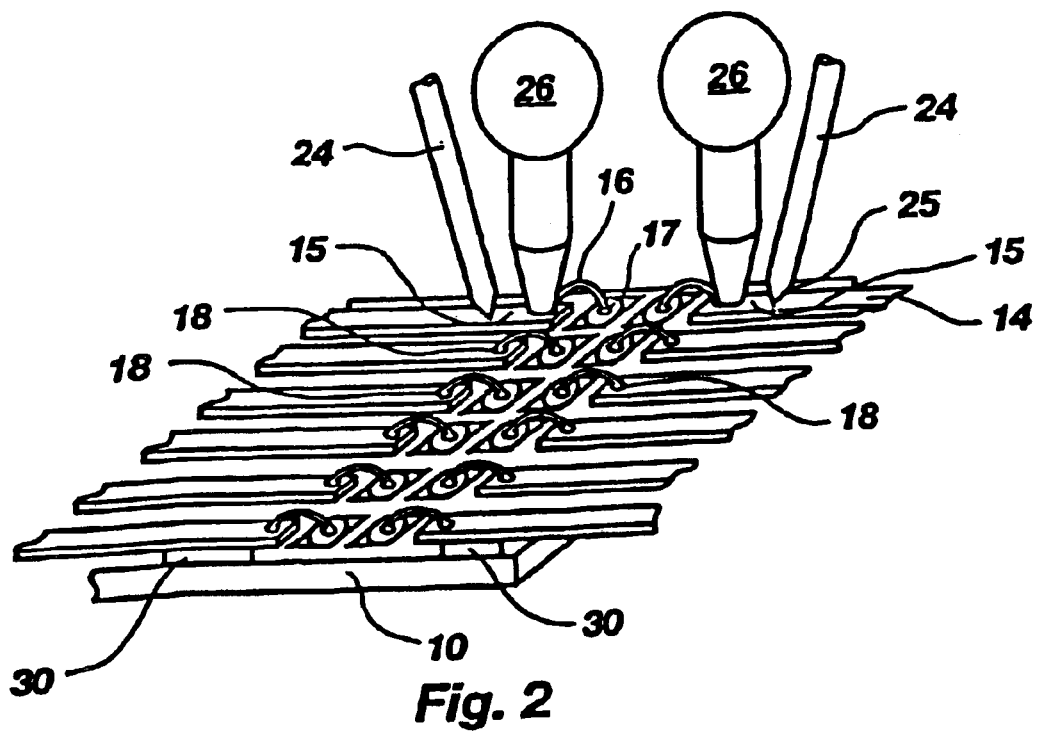
FIG. 2 is a perspective view of a lead-over-chip semiconductor device having the bond pads thereof connected to the lead fingers of a lead frame using penetrating independent individual clamps of the present invention.

Referring to drawing FIG. 2, a lead-over-chip configuration using the present invention is shown. The lead fingers 14 are located over the chip or die 10 for wire bonding thereto. In such a configuration, the lead fingers 14 are secured to the die 10 by insulating adhesive strips 30. During the bond operation, one or more of the independent clamps 24 having a lead finger penetrating portion 25 located on the end thereof clamps the end 15 of lead finger 14 prior to the bonding of a wire 16 thereto by one or more of the bonding apparatus 26. The independent clamp 24 applies sufficient pressure to the end 15 of the lead finger 14 to compress the insulating adhesive strips 30 to ensure a satisfactory bond between the end of any wire 16 and the end 15 of the lead finger 14.

Figure 3:
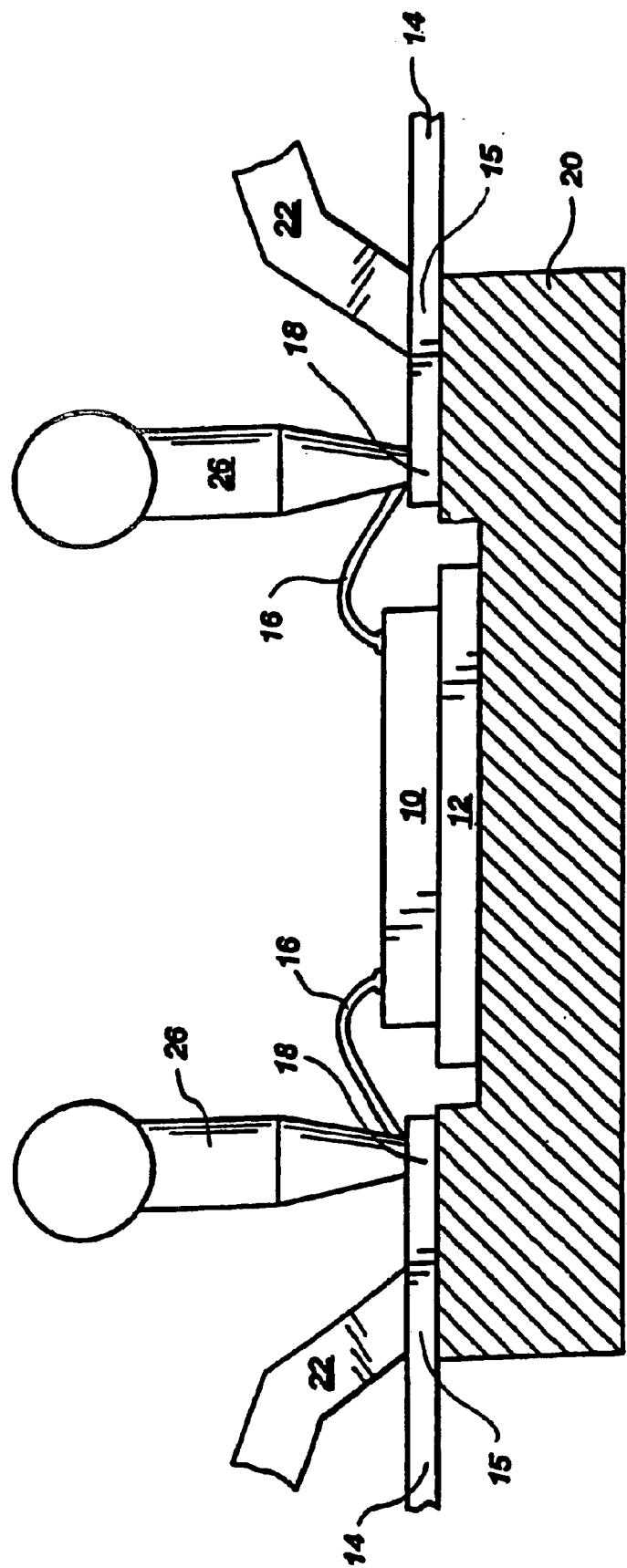
FIG. 3 is a side view of the individual independent clamps used in the wire bonding of a semiconductor chip arrangement.

Referring to drawing FIG. 3, a chip or die 10 is shown having a plurality of wires 16 bonded thereto. As shown, one or more of the fixed clamps 22 contacts the end 15 of lead finger 14 aft of the area of the bond of the other end 18 to the lead finger 14. The bonds of the other end 18 of wire 16 to the end 15 of the lead finger 14 are typically a wedge type wire bond, although a ball bond may be made if desired. As shown, the heat block 20 is in contact with the paddle 12 of the lead frame and the lead fingers 14.

Figure 3A:
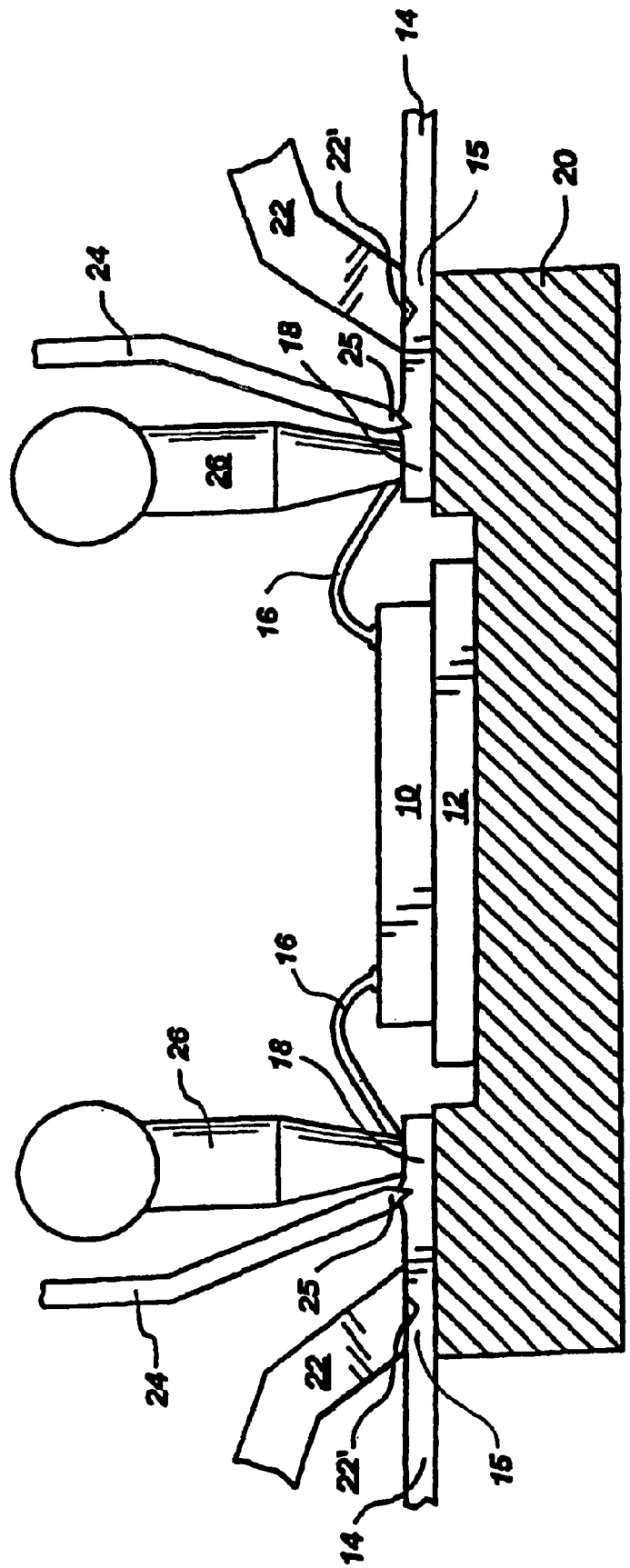
FIG. 3A is a side view of penetrating individual independent clamps of the present invention used in the wire bonding of a semiconductor chip arrangement.

Referring to drawing FIG. 3A, a chip or die 10 is shown having a plurality of wires 16 bonded thereto using the present invention. As shown, one or more of the independent clamps 24 having lead finger penetrating portions 25 located thereon contacts and penetrates the end 15 of lead finger 14 aft of the area of the bond of the other end 18 of wire 16 to the lead finger 14. As also shown, the fixed clamps 22 are formed to have penetrating portions 22' thereon which penetrate the end 15 of lead finger 14. In this manner, the end 15 of the lead finger 14 provides improved clamping and immobilization of a lead finger 14 during the wire bonding process as well as ensures that the lead finger 14 is in intimate contact with the heat block 20 for effectiveness. The bonds of the other end 18 of wire 16 to the end 15 of the lead finger 14 are typically a wedge type wire bond, although a ball bond may be made if desired. As shown, the clamps 22 and 24 having lead finger penetrating portions thereon, cause the lead finger 14 to engage heat block 20, as well as cause heat block 20 to be in contact with the paddle 12 of the lead frame. However, care should be taken to prevent the lead finger penetrating portion 25 of the independent clamp 24 from either damaging the lead finger 14, affecting its electrical characteristics, or severing the lead finger 14.

Figure 4:
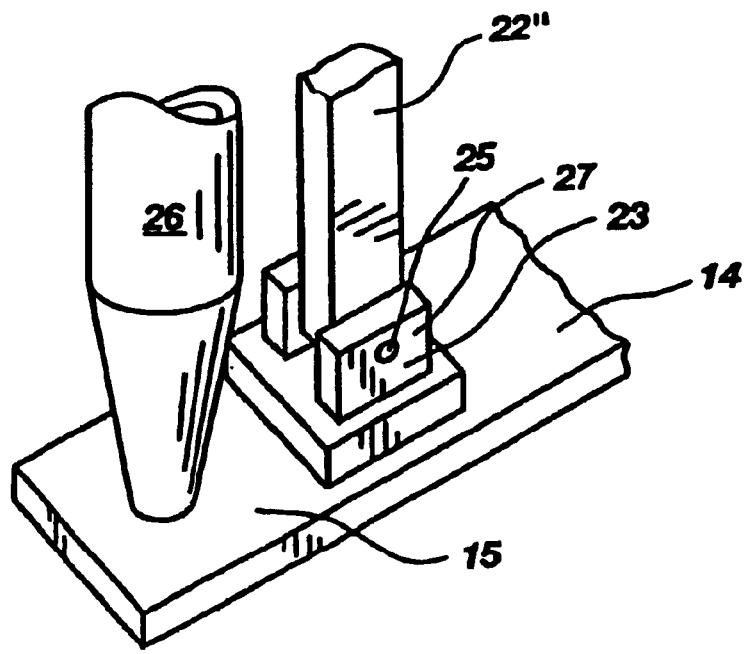
FIG. 4 is a perspective view of a second alternative type of individual independent lead clamps used in the wire bonding of a lead of a lead frame of the present

Referring to drawing FIG. 4, a portion of a lead finger 14 is shown in conjunction with a bonding apparatus 26 and modified independent penetrating lead clamp 22". The independent lead clamp 22" is formed having a modified end or foot 23 thereon to provide a larger clamping area of the clamp 22" on the end 15 of the lead finger 14 during bonding operations. The modified end or foot 23 is substantially the same width as the lead finger 14 and may be mounted to have articulated movement about the end of the independent clamp 22", such as using a pin extending through suitable apertures in a pair of ears 27 attached to the foot 23 and the end of the modified independent clamp 22" for illustration purposes. Located on the bottom of the modified end or foot 23 of the clamp 22" are suitable lead finger 14 penetrating members (not shown) which penetrate the lead finger 14 to immobilize it during wire bonding operations as described hereinbefore.

Figure 4A:
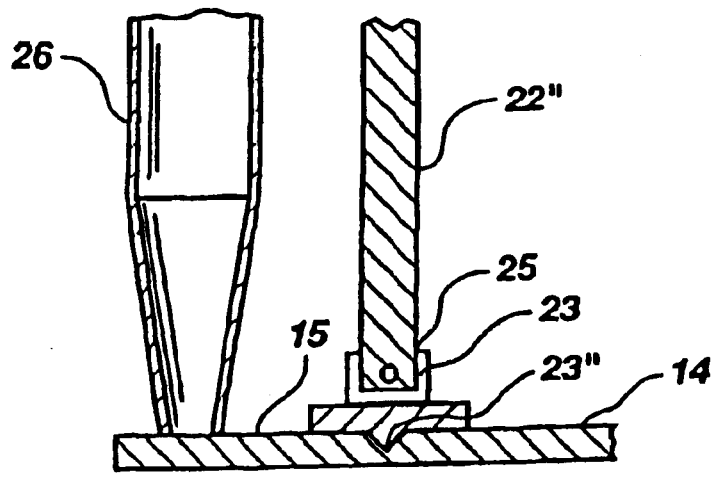
FIG. 4A is a cross-sectional view of penetrating individual independent clamps of the type illustrated in drawing FIG. 4 of the present invention.

Referring to drawing FIG. 4A, the lead finger penetrating portion 23" of the foot 23 is shown in relation to the bonding apparatus 26 and lead finger 14. The lead finger penetrating portion 23" partially penetrates the lead finger 14 to immobilize the end 15 thereof during wire bonding operations by the bonding apparatus 26. The lead finger penetrating portion 23" may penetrate the lead finger 14 to any desired depth depending upon the thickness thereof. However, care should be taken to prevent the lead finger penetrating portion 23" from either damaging the lead finger 14, affecting its electrical characteristics, or severing the lead finger 14.

Figure 4B:
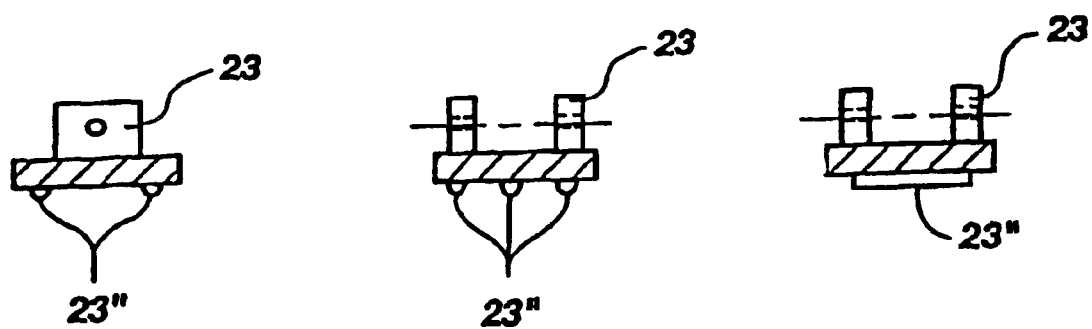
FIG. 4B are cross-sectional views of penetrating individual independent clamps of the type illustrated in drawing FIG. 4 of the present invention.

Referring to drawing FIG. 4B, various embodiments of the lead finger penetrating portion 23" of foot 23 are shown. As shown the lead finger penetrating portion 23" may comprise a plurality of round shaped members located to either extend along the axis of a lead finger 14 or extend transversely thereof or may comprise a knife edge shape extending transversely across the axis of a lead finger 14. The shapes are to be merely illustrative of a variety of shapes for the lead finger penetrating portion 23" which may be used.

Figure 5:
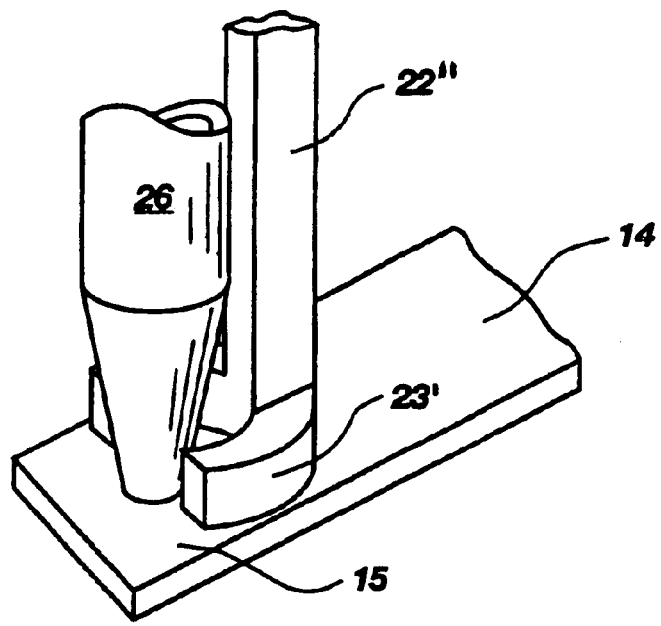
FIG. 5 is a perspective view of a third alternative type of independent individual lead clamp used in the wire bonding of a lead of a lead frame of the present invention.

Referring to drawing FIG. 5, an independent clamp 22" is shown having a modified end or foot 23' located on the end thereof. The end or foot 23' may be integrally attached to the independent clamp 22" or may have an articulated mounting arrangement, such as shown in drawing FIG. 4. In this instance, the modified end or foot 23' is generally semicircular, or arcuate, in configuration so as to engage a large portion of the end 15 of the lead finger 14 surrounding the bonding apparatus 26 during the wire bonding operation to hold the end 15 in position.

Referring to drawing FIGS. 5A through 5D, the foot 23' is shown having various lead finger penetrating portions 23''' thereon. As illustrated, the various lead finger penetrating portions 23''' include either a knife edge shape, as illustrated in drawing FIGS. 5A and 5B, or a blunted edge (rounded edge) shape, as illustrated in drawing FIGS. 5C and 5D. Such shapes of the lead finger penetrating portion 23''' are to be considered merely as illustrations as other shapes for the penetrating portions may be used. As previously described, the lead finger penetrating portion 23''' may penetrate the lead finger 14 to any desired depth depending upon the thickness thereof. However, care should be taken to prevent the lead finger penetrating portion 23''' from either damaging the lead finger 14, affecting its electrical characteristics, or severing the lead finger 14.

Figure 6:
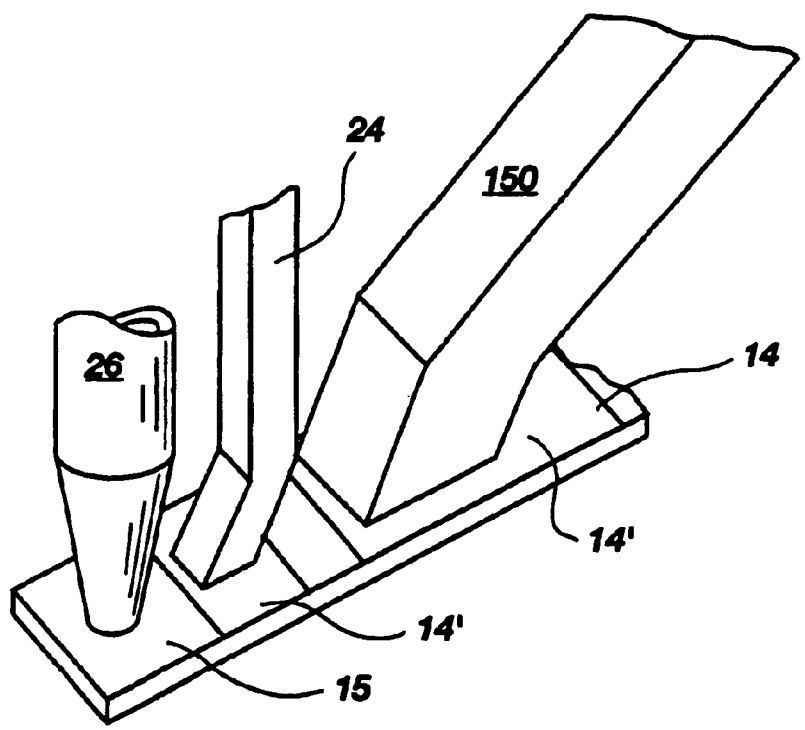
FIG. 6 is a perspective view of the use of two independent individual lead clamps used in the wire bonding of a lead of a lead frame of the present invention.
Figure 5A:
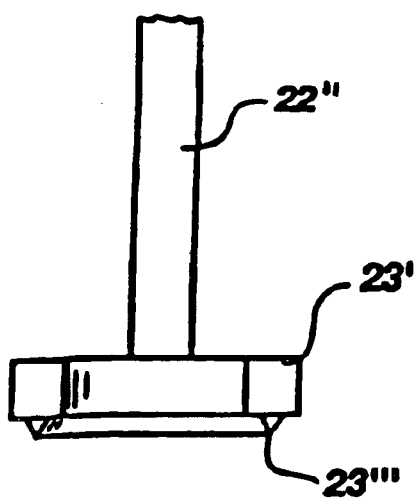
FIG. 5A is a front view of the penetrating independent individual lead clamp shown in FIG. 5 of the present invention.
Figure 5B:
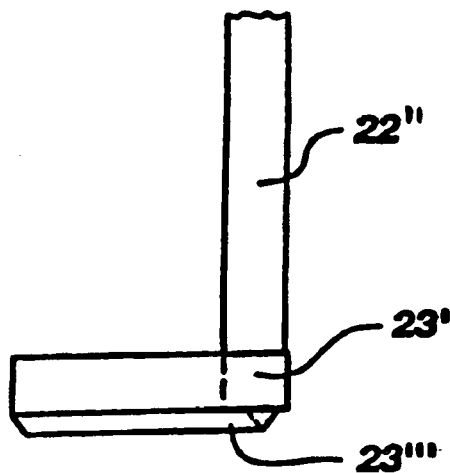
FIG. 5B is a side view of the penetrating independent individual lead clamp shown in FIG. 5 of the present invention.
Figure 5C:
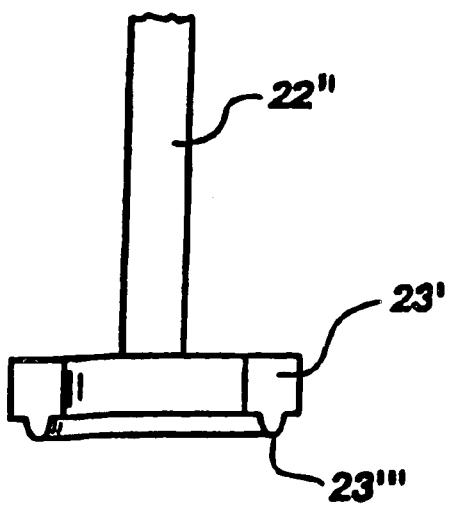
FIG. 5C is a front view of another type of penetrating independent individual lead clamp shown in FIG. 5 of the present invention.
Figure 5D:
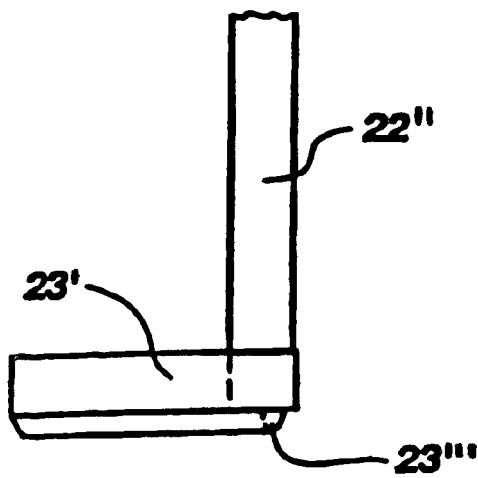
FIG. 5D is a side view of the penetrating independent individual lead clamp shown in FIG. 5 of the present invention.

Referring to drawing FIG. 6, the independent clamp 24 is shown in relation to the bonding apparatus 26 on the end 15 of a lead finger 14 as well as further being shown in relation to a second independently actuated clamp 150 located thereon. During wire bonding operations, both clamps 24 and 150 have portions on the bottom thereof (not shown) for penetrating the lead finger 14 to immobilize the same during wire bonding operations. The second independently actuated clamp 150 may be of any suitable type and structure such as described and illustrated hereinbefore. The independent clamp 24 and second clamp 150 may be actuated independently of each other and independently of the bonding apparatus 26 as described and illustrated hereinbefore. Also shown is a soft metal coating 14' located on the lead finger 14 which is penetrated by either the independent clamp 24 or the second clamp 150. The soft metal coating 14' applied to the lead finger 14 may be of any suitable type, such as gold, silver, aluminum, etc., which will allow for the easy penetration of the coating 14' by a portion of either the independent clamp 24 or the second clamp 150.

Figure 6A:
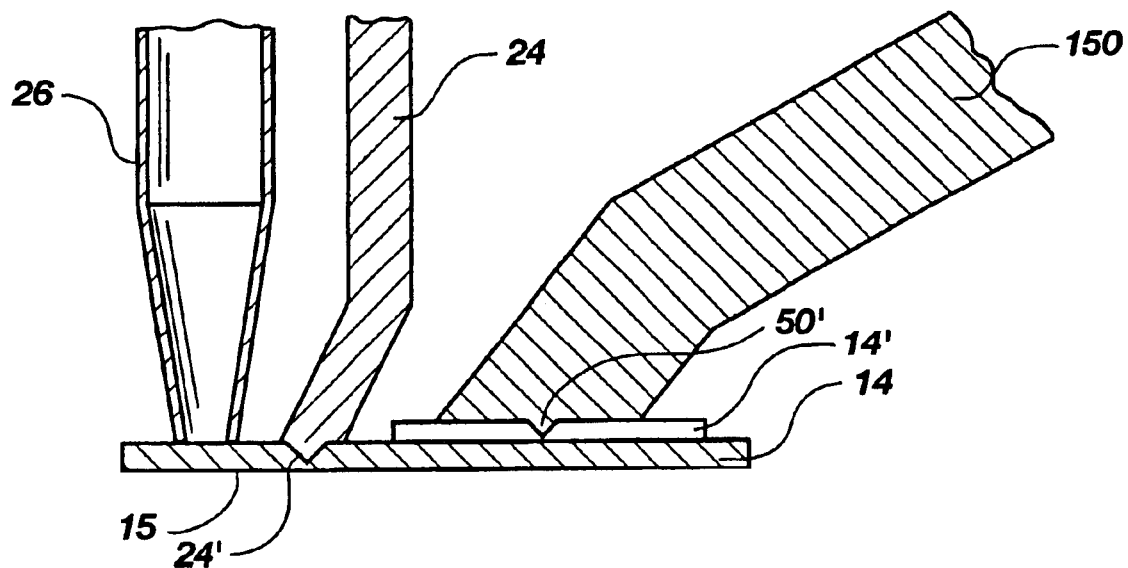
FIG. 6A is a cross-sectional view of penetrating independent individual lead clamps of the present invention as shown in FIG. 6 of the present invention.

Referring to drawing FIG. 6A, the independent clamp 24 is shown having a lead finger penetrating portion 24' on the end thereof and clamp 150 is shown having a lead finger penetrating portion 50' on the end thereof penetrating the soft metal coating 14' on the lead finger 14, both portions 24' and 50' penetrating either the lead finger 14 or the soft metal coating 14' on the lead finger 14 being wire bonded by bonding apparatus 26. As previously described, the lead finger penetrating portions 24' and 50' may penetrate the lead finger 14 or any soft metal coating thereon to any desired depth depending upon the thickness thereof. However, care should be taken to prevent the lead finger penetrating portions 24' and 50' from either damaging the lead finger 14, affecting its electrical characteristics, or severing the lead finger 14.

Figure 6B:
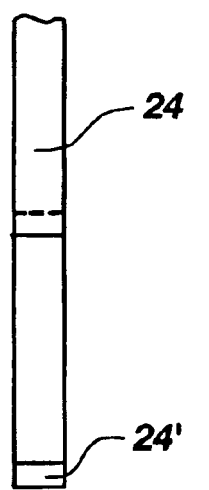
FIG. 6B is a front view of one of the penetrating independent individual lead clamps as shown in FIG. 6A of the present invention.

Referring to drawing FIG. 6B, the independent clamp 24 is illustrated having a knife edge type penetrating portion 24' thereon which extends transversely across the axis of a lead finger 14 (not shown). It should be understood that any suitable shape penetrating portion 24' may be used on independent clamp 24.

Figure 6C:
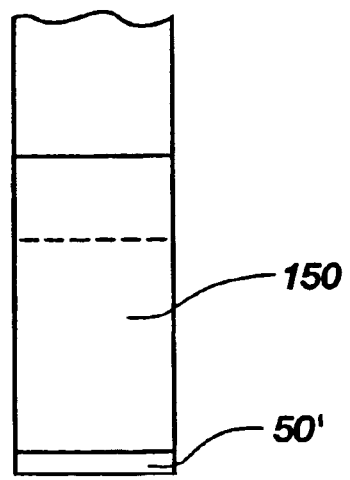
FIG. 6C is a front view of the other penetrating independent individual lead clamps as shown in FIG. 6A of the present invention.

Referring to drawing FIG. 6C, the clamp 150 is illustrated having a knife edge type penetrating portion 50' thereon which extends transversely across the axis of a lead finger 14 (not shown). It should be understood that any suitable shape penetrating portion 50' may be used on clamp 150.

Figure 7:
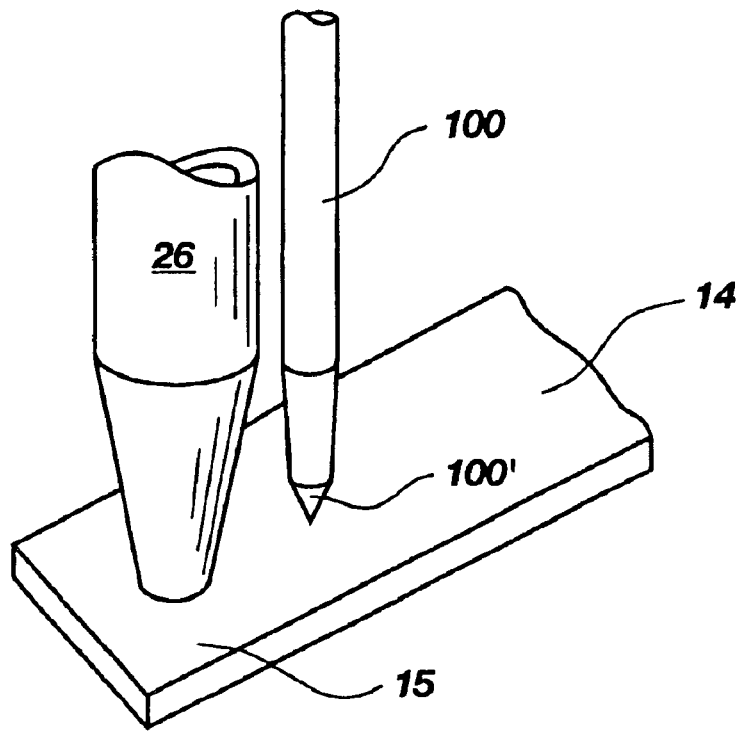
FIG. 7 is a perspective view of another penetrating independent individual lead clamp used in the wire bonding of a lead of a lead frame of the present invention.

Referring to drawing FIG. 7, a portion of a lead finger 14 is illustrated in relation to a bonding apparatus 26 and independent individual clamp 100 having a penetrating point 100' thereon. The clamp 100 is generally circular in shape having a frustoconical penetrating point 100' thereon for penetrating a lead finger 14.

Figure 7A:
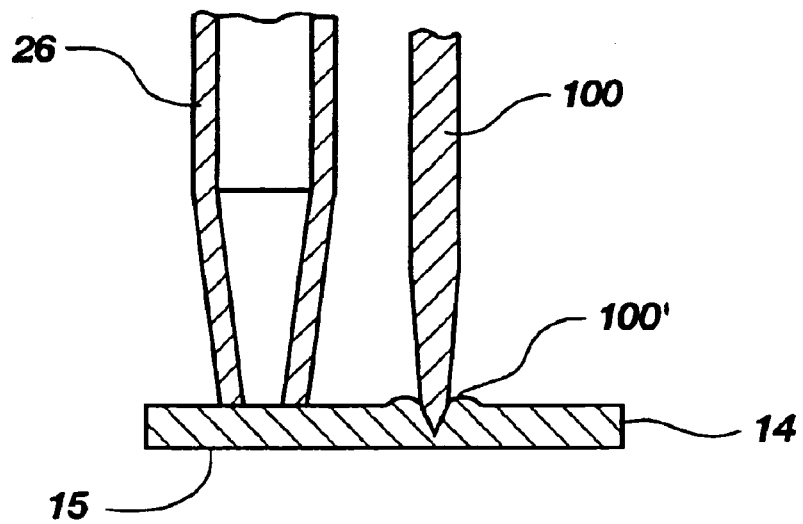
FIG. 7A is a side view of the penetrating independent individual lead clamp of FIG. 7 of the present invention.

Referring to drawing FIG. 7A, the clamp 100 having penetrating point 100' thereon and the bonding apparatus 26 are shown in cross-section in relation to the penetrating and clamping of a lead finger 14 during wire bonding thereof. The penetrating point 100' penetrates the lead finger 14 to immobilize the lead finger 14 during the wire bonding operation. As previously stated, care should be taken to prevent the lead penetrating point 100' from either damaging the lead finger 14, affecting its electrical characteristics, or severing the lead finger 14.

Figure 8:
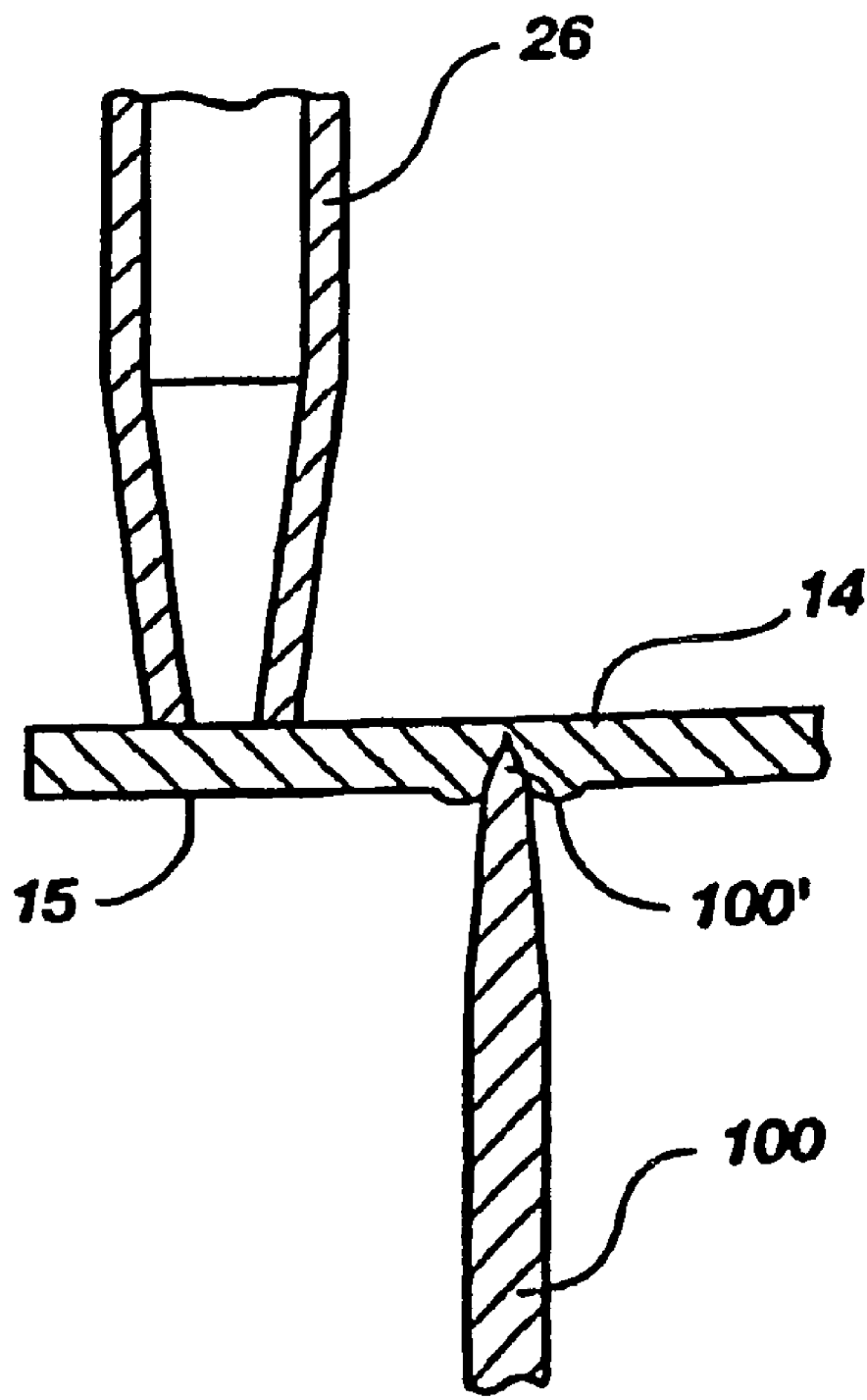
FIG. 8 is a side view of the penetrating independent individual lead clamp of the present invention.

Referring to drawing FIG. 8, a bonding apparatus 26 is illustrated in relation to a lead finger 14 with the independent individual clamp 100 having a penetrating point 100' thereon. As illustrated, the clamp 100 is acting on the opposite side of the lead finger 14 from the bonding apparatus 26. It should be understood that any of the penetrating clamps hereinbefore described may act on the opposite side of the bonding apparatus 26 during the wire bonding operations regarding a lead finger 14. It is hot necessary that the penetrating clamp be positioned on the same side of the lead finger 14 as the bonding apparatus 26. As stated previously, care should be taken to prevent the lead penetrating point 100', or the penetrating portion of any penetrating clamp hereinbefore described, from either damaging the lead finger 14, affecting its electrical characteristics, or severing the lead finger 14.

METHOD OF BONDING

Referring to drawing FIGS. 1 through 3, in the method of the present invention, a chip or die 10 is positioned within the bonding area of the bonding apparatus 26. If desired for use in addition to a penetrating individual independent clamp 24, a conventional or penetrating clamp 22 serves to help straighten the lead frame and position the lead fingers 14 during subsequent bonding operations. Next, the chip or die 10 and the lead finger 14 are heated to the desired temperature before bonding operations by the heat block 20. At this time, the penetrating individual independent clamp 24 is engaged, moved to the appropriate lead finger 14 which is to have a wire bonded thereto, and actuated to clamp and immobilize the end 15 of the lead finger 14 against the heat block 20 or the adhesive strip 30. The wire bonding apparatus 26 is then actuated to form a wire bond on end 17 of wire 16 to an appropriate bond pad on chip or die 10. After the formation of the bond of end 17 of wire 16 to the bond pad of die 10, the bonding apparatus is moved to the appropriate end 15 of lead finger 14 for the formation of a suitable wire bond thereto by other end 18 of wire 16. After the formation of the bond of the other end 18 of wire 16 to the end 15 of lead finger 14, the penetrating individual independent clamp 24 and the bonding apparatus are actuated to remove the independent clamp 24 and the bonding apparatus 26 from the end 15 of the lead finger 14. Alternately, the bonding apparatus 26 is actuated to remove the apparatus from the bond location at the end 15 of the lead finger 14 prior to or after the removal of the penetrating individual independent clamp 24 from a lead finger 14. During the removal of the bonding apparatus 26 from the end 15 of the lead finger 14 the conventional or penetrating clamp 22, if in contact with the end 15 of a lead finger 14, supplies the necessary force to retain the lead finger 14 in position relative to other lead fingers located around chip or die 10, both bonded and unbonded. As previously stated, it is not necessary for the penetrating individual independent clamp 24 to remain in contact with the end 15 of lead finger 14 during the removal of the bonding apparatus 26 therefrom. After the wire 16 has been bonded to the desired bond pad of die 10 and end 15 of lead finger 14, the process is repeated until all desired wire bonds between lead fingers 14 and the bond pads of chip or die 10 are completed.

If desired to have additional clamping of the lead finger 14, either a fixed conventional or penetrating clamp 22 and/or a second penetrating individual independent clamp 24 may be used with the bonding apparatus 26. The second penetrating individual independent clamp 24 may be actuated and moved from the lead finger 14 with, before or after the bonding apparatus 26 from the lead finger 14.

It will be understood that the present invention may have changes, additions, deletions, modifications, and sequence of operation which fall within the scope of the invention. For instance, the fixed clamp may be eliminated and a second independent clamp used in its place.

What is claimed is:

1. Apparatus to increase stability for lead fingers of a lead frame during a wire bonding operation comprising:
    a clamp for engaging a portion of each lead finger of a lead frame during a wire bonding operation of each lead finger of the lead frame for connecting a bond pad of a semiconductor die to the portion of each lead finger using a piece of wire, the clamp having a substantially smooth planar lead finger contacting portion and at least one discrete lead finger penetrating feature extending therefrom for penetrating the portion of each lead finger for immobilizing the portion of each lead finger.

2. The apparatus of claim 1, wherein the clamp comprises:
    an independent clamp having an ability to move independently in x-axis, y-axis and z-axis directions.

3. The apparatus of claim 1, wherein the clamp is moveable independently in any direction of movement of the apparatus.

4. The apparatus of claim 1, wherein the clamp comprises:
    a fixed clamp for engaging the portion of each lead finger of the lead frame.

5. The apparatus of claim 1, wherein the apparatus exerts a force of substantially 50 to 100 grams for contacting the portion of each lead finger.

6. The apparatus of claim 1, further comprising:
    heating apparatus located beneath the semiconductor die.

7. The apparatus of claim 6, further comprising:
    heating apparatus located beneath each lead finger.

8. The apparatus of claim 6, wherein the heating apparatus operates at substantially at least 200° C. to heat the semiconductor die.

9. The apparatus of claim 6, wherein the semiconductor die is heated before being connected to each lead finger.

10. The apparatus of claim 1, wherein the clamp is resiliently mounted with respect to each lead finger of the lead frame.

11. The apparatus of claim 10, wherein the clamp is resiliently mounted through use of a spring engaging a portion of the clamp.

12. The apparatus of claim 1, wherein the clamp has an end portion thereof including an edge.

13. The apparatus of claim 1, wherein the clamp includes an end portion thereof having a substantially semicircular shape.

14. The apparatus of claim 1, wherein the clamp includes an end portion thereof having a substantially arcuate shape.

15. The apparatus of claim 1, wherein the clamp includes a substantially articulated end portion thereof for movement for contacting the portion of each lead finger.

16. The apparatus of claim 1, wherein the clamp includes a portion for penetrating a portion of a thickness of a soft metal coating located on each lead finger.

17. The apparatus of claim 1, wherein the at least one discrete lead finger penetrating feature includes a point on an end thereof.

18. The apparatus of claim 1, further including:
    a fixed clamp for engaging another portion of each lead finger.

19. The apparatus of claim 1, wherein the at least one discrete lead finger penetrating feature includes a sharp edge thereon.

20. The apparatus of claim 1, wherein the at least one discrete lead finger penetrating feature includes a rounded portion on a bottom thereof.

21. The apparatus of claim 1, wherein the at least one discrete lead finger penetrating feature includes a plurality of rounded portions on a bottom thereof.

22. Apparatus to increase stability for lead fingers of a lead frame during a wire bonding operation comprising:
    a clamp for engaging a portion of each lead finger of a lead frame during a wire bonding operation of each lead finger of the lead frame for connecting a bond pad of a semiconductor die to the portion of each lead finger using a piece of wire, the clamp having a frustoconical end extending to a single point for penetrating the portion of each lead finger for immobilizing the portion of each lead finger.

* * * * *